US009040818B2

(12) United States Patent
Duan

(10) Patent No.: US 9,040,818 B2
(45) Date of Patent: May 26, 2015

(54) DUST-PROOF MECHANISM AND ELECTRONIC DEVICE USING THE SAME

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Ju-Ping Duan, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 85 days.

(21) Appl. No.: 14/014,622

(22) Filed: Aug. 30, 2013

(65) Prior Publication Data

US 2014/0076599 A1 Mar. 20, 2014

(30) Foreign Application Priority Data

Sep. 20, 2012 (CN) ........................ 2012 1 03503450

(51) Int. Cl.

*H05K 5/00* (2006.01)
*H05K 5/02* (2006.01)
*H01R 13/52* (2006.01)
*H01R 24/58* (2011.01)

(52) U.S. Cl.

CPC .............. *H05K 5/02* (2013.01); *H01R 13/5202* (2013.01); *H01R 24/58* (2013.01); *Y10S 248/906* (2013.01)

(58) Field of Classification Search

USPC .............................. 174/50; 439/538; 248/906
See application file for complete search history.

(56) References Cited

U.S. PATENT DOCUMENTS 4,611,406 A * 9/1986 Engstrom et al. ............... 33/443
7,947,902 B2 * 5/2011 Tang .............................. 174/50
7,964,794 B2 * 6/2011 Chung ............................ 174/58
8,835,758 B2 * 9/2014 Li et al. .......................... 174/50

FOREIGN PATENT DOCUMENTS

TW M334520 U 6/2008
TW M334533 U 6/2008

* cited by examiner

*Primary Examiner* — Dhirubhai R Patel
(74) *Attorney, Agent, or Firm* — Novak Druce Connolly Bove + Quigg LLP

(57) ABSTRACT

An electronic device with an inbuilt mechanism sealing unused interface holes, or gaps, against dust is disclosed. The dust-proof mechanism includes two blocking members and two elastic members. The two blocking members are movably mounted on a bottom wall of a housing and close an interface hole in the manner of drawn curtains. The two blocking members are urged together by the elastic members. When an object is inserted into the interface hole, the guiding surfaces guide and ride over the inserted object, moving the two blocking members away from each other. When the object is pulled out of the interface hole, the two blocking members are moved back toward each other by the elastic members.

18 Claims, 7 Drawing Sheets

DUST-PROOF MECHANISM AND ELECTRONIC DEVICE USING THE SAME

BACKGROUND

1. Technical Field

The present disclosure relates to dust-proof mechanisms, and particularly to a dust-proof mechanism for an electronic device and the electronic device using the dust-proof mechanism.

2. Description of the Related Art

Electronic devices include a plurality of interfaces, such as an earphone hole, a USB interface, and an electrical recharging interface. Dust may enter into the interfaces. Detachable covers may be placed on the interfaces for preventing the dust from entering into the interfaces. However, users may forget to replace the cover after usage, or the covers may be easily lost or damaged.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

Figure 1:
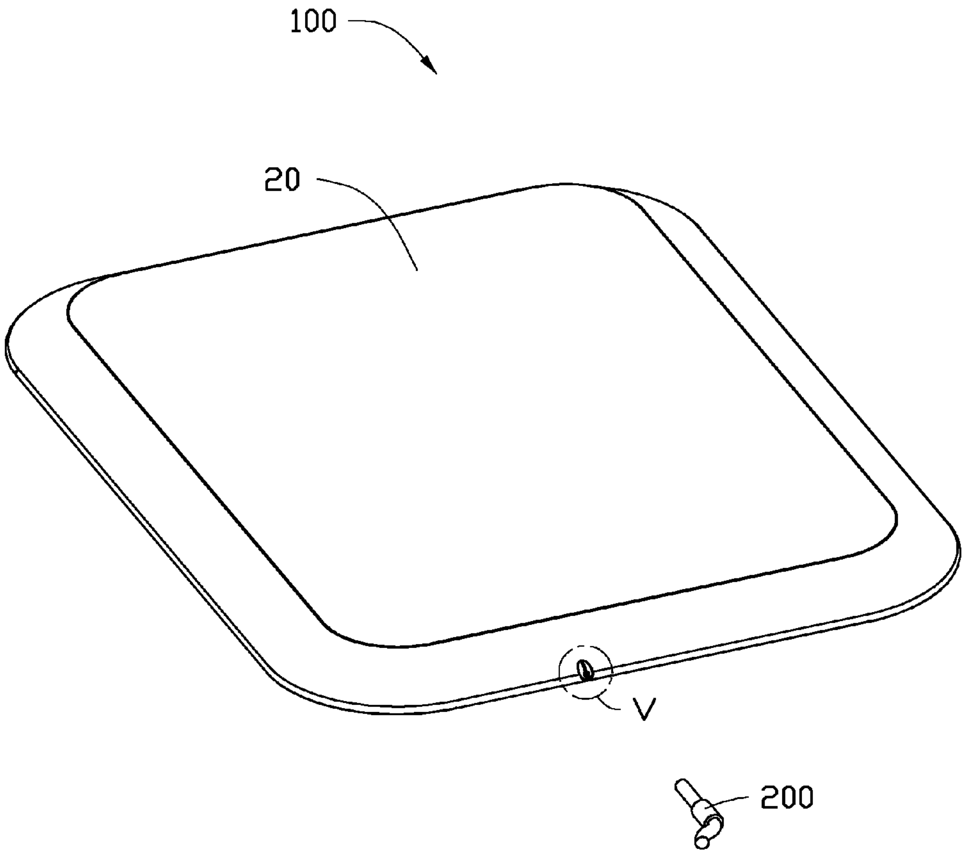
FIG. 1 is an assembled, isometric view of one embodiment of an electronic device.
Figure 2:
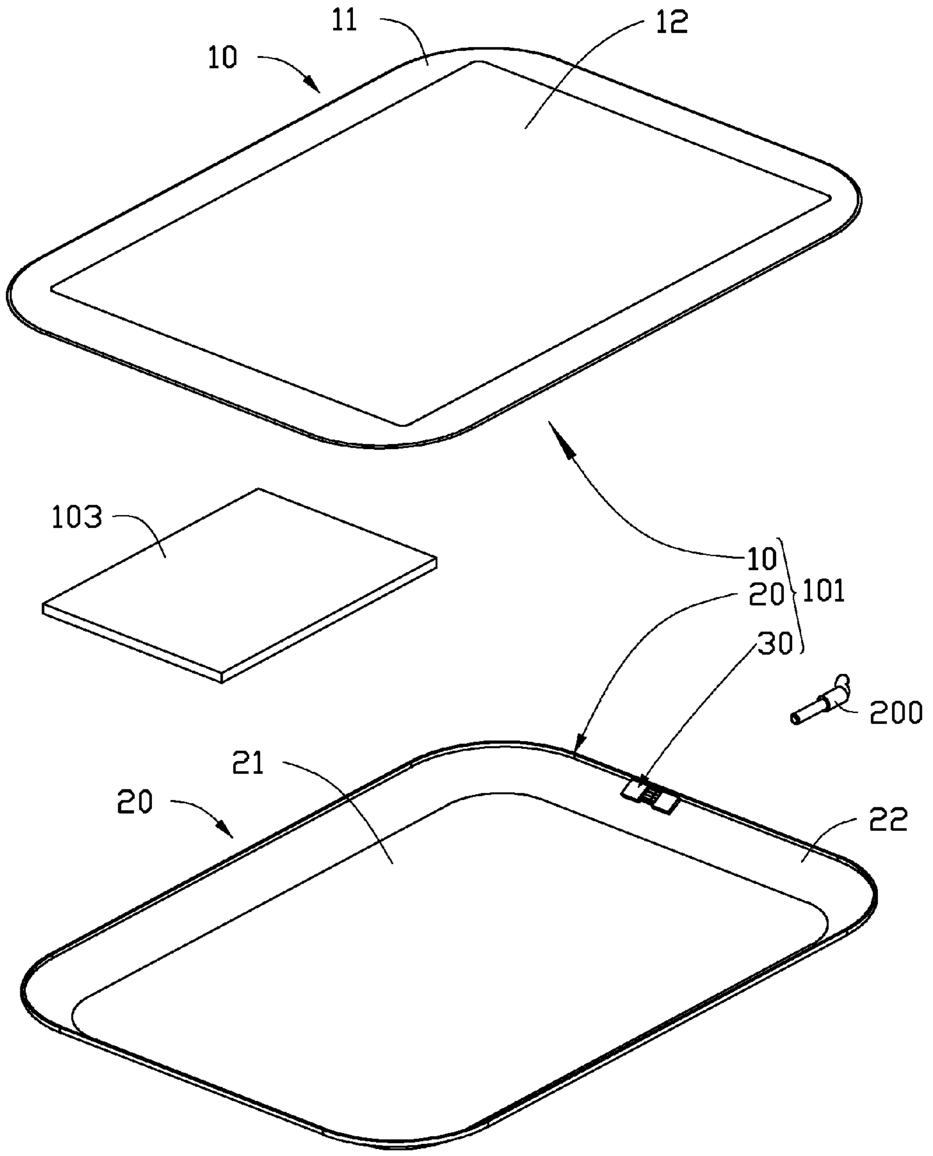
FIG. 2 is a partially exploded, isometric view of the electronic device of FIG. 1, including a first embodiment of a dust-proof mechanism.

FIGS. 1 and 2 show an embodiment of an electronic device 100. The electronic device 100 includes a housing assembly 101. The housing assembly 101 includes a top housing 10, a bottom housing 20, and a dust-proof mechanism 30. The electronic device 100 further includes other functional modules, such as a circuit board 103, a display module (not shown), and a CPU module (not shown), for example. For simplicity, only the top housing 10, the bottom housing 20, and the dust-proof mechanism 30 are described in detail. The top housing 10 is matched with the bottom housing 20. The electronic device 100 can be a mobile phone, a PDA, an MP4, or a tablet computer. In the embodiment, the electronic device 100 is a mobile phone.

Figure 3:
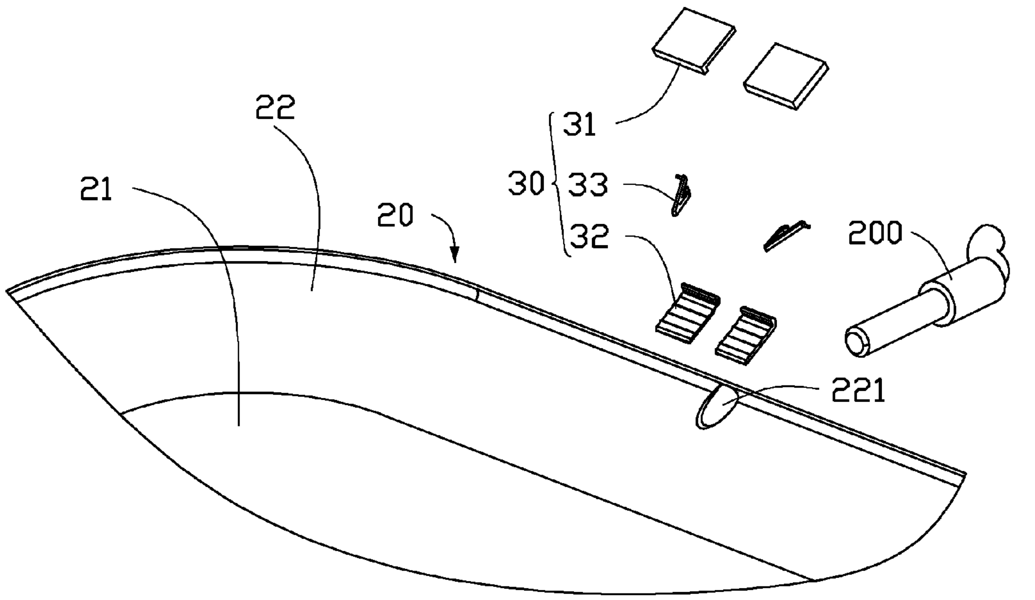
FIG. 3 is an exploded, isometric view of the first embodiment of a dust-proof mechanism.
Figure 4:
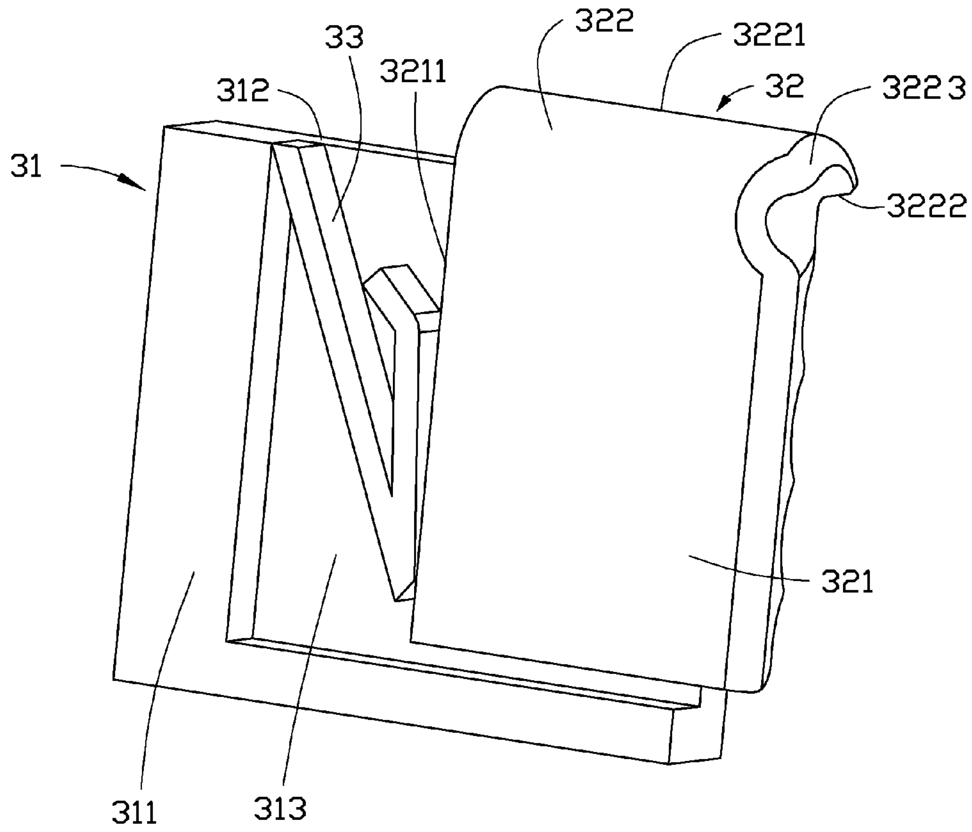
FIG. 4 is an enlarged, assembled, isometric view of the dust-proof mechanism in FIG. 3.
Figure 5:
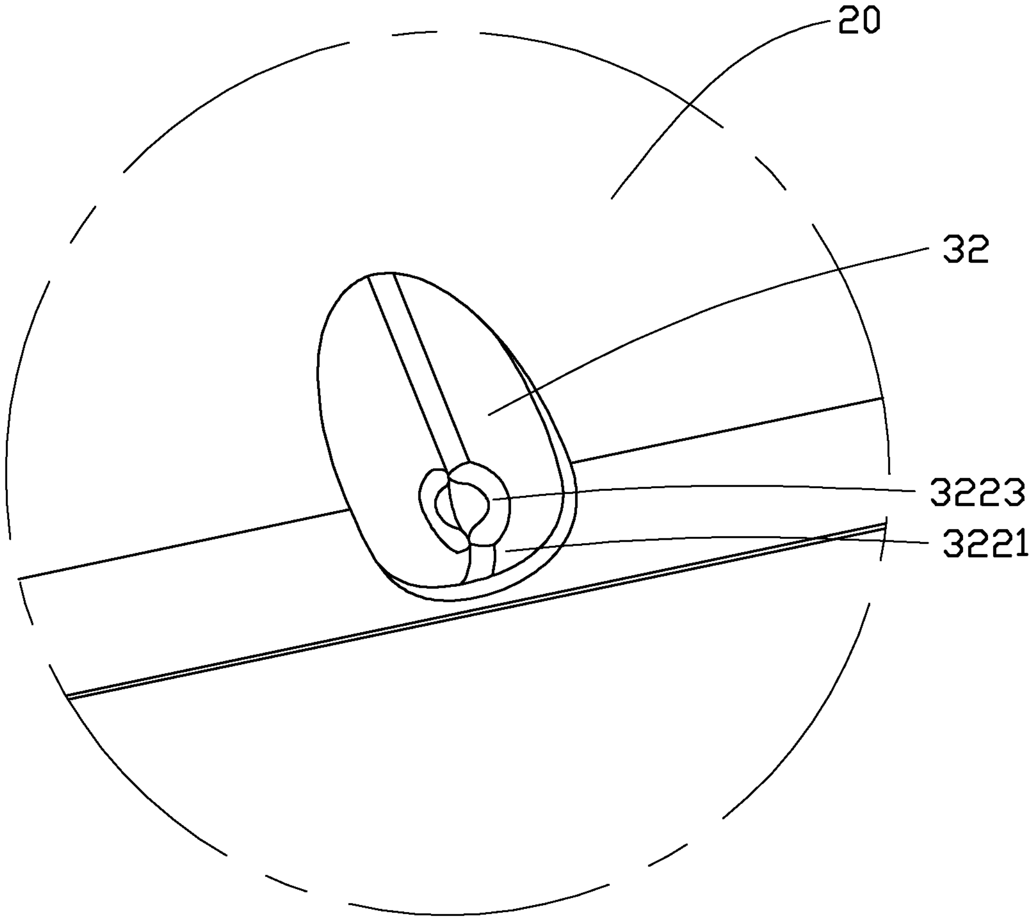
FIG. 5 is an enlarged view of portion V in FIG. 1.
Figure 6:
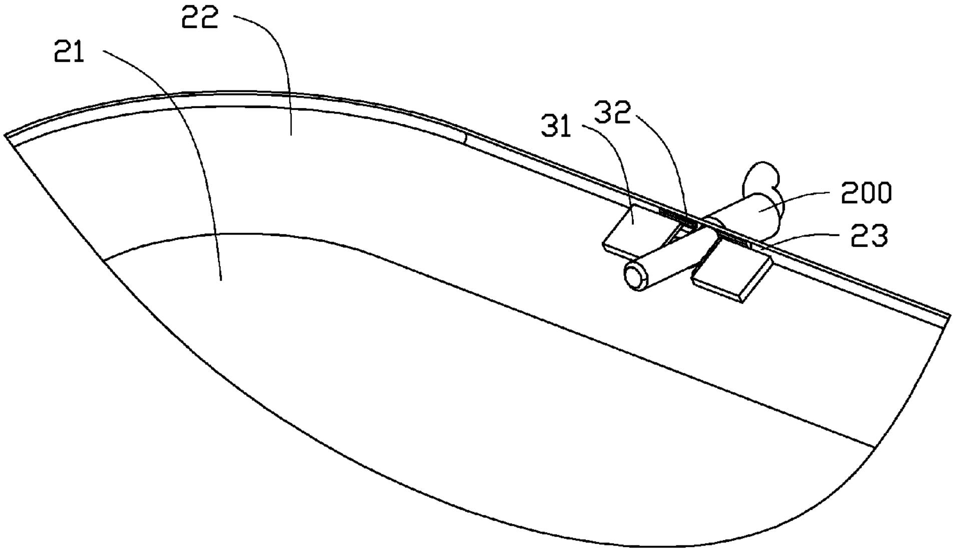
FIG. 6 shows an insert in an interface hole of the electronic device of FIG. 1.

The top housing 10 includes a frame 11 and a display portion 12 formed in the frame 11. The bottom housing 20 includes a bottom wall 21, and a sidewall 22 substantially perpendicularly extending from a periphery of the bottom wall 21. The bottom wall 21 and the sidewall 22 cooperatively define a receiving space, for receiving the dust-proof mechanism 50 and other function modules. The sidewall 22 defines an interface hole 221 (shown in FIG. 3). An insert 200 can be inserted into the interface hole 221, for connection into the electronic device 100 for a certain function, such as for recharging, for connecting to an earphone, and for connecting to an independent computer, for example.

FIGS. 3 through 6 show the dust-proof mechanism 30 in detail. The dust-proof mechanism 30 is placed inside of the bottom housing 20 corresponding to the interface hole 221. The interface hole 221 can be opened or sealed by the dust-proof mechanism 30. The interface hole 221 can be an earphone hole, a charging hole, a USB hole, or the like. In the embodiment, the interface hole 221 is an earphone hole. The dust-proof mechanism 30 includes a pair of mounting members 31, a pair of blocking members 32, and a pair of elastic members 33. The mounting members 31 are oppositely mounted inside of the bottom housing 20. Each blocking member 32 is connected to a mounting member 31 by an elastic member 33, such that the blocking members 32 are movable relative to the bottom housing 20. In other words, an elastic member 33 is between one mounting member 31 and one blocking member 32.

Each of the mounting members 31 includes a main body 311 and a receiving portion 313 formed by a depression in the main body 311. The main body 311 includes a top surface 312. The receiving portion 313 has an opening facing the sidewall 22 and the other mounting member 31. The mounting member 31 is securely mounted on the bottom housing 20 by screws, pins, or adhesive. The top surface 312 and the sidewall 22 cooperatively define a support portion 23 (shown in FIG. 6). In the embodiment, the support portion 23 is a guiding groove. The blocking members 32 are slidable in the support portion 23. In other embodiments, the mounting members 31 can be integrally formed with the bottom housing 20. That is to say, the mounting members 31 can be a part of the bottom housing 20.

Each of the blocking members 32 includes a base portion 321 and a resisting portion 322 extending from the base portion 321. The base portion 321 is slidably received in the receiving portion 313. Opposite surfaces of the base portion 321 contact the bottom wall 21 and the receiving portion 313. The resisting portion 322 includes a resisting surface 3221 and an end surface 3222 connected to the resisting surface 3221. The resisting surface 3221 contacts the sidewall 22. The end surface 3222 contacts the top surface 312 of the main body 311. In other words, the blocking member 32 is latched in the receiving portion 313 and in the support portion 23 by the mounting member 31 and the bottom housing 20. The resisting portion 322 further includes an inclined guiding surface 3223 communicating with the interface hole 221, such that when the insert 200 is inserted into the interface hole 221, the blocking members 32 are forced away from each other because of the inclined guiding surface 3223.

The elastic member 33 can be a bent elastic sheet or a hairpin spring. In the first embodiment, the elastic member 33 is a bent elastic sheet. One end of the elastic member 33 is connected to the mounting member 31, and the other end of the elastic member 33 is connected to the blocking member 32.

In assembly, the same ends of the elastic members 33 are connected to the mounting members 31. The mounting members 31 with the elastic members 33 attached are fixed to two sides of the interface hole 211 on the bottom wall 21. The base portions 321 of the blocking members 32 are inserted into the receiving portion 313 and connected to the other ends of the elastic members 33, and thereby the resisting portions 322 are received in the support portion 23.

The elastic member 33 is compressible between the mounting member 31 and the blocking member 32, and the two blocking members 32 are pushed together by the elastic members 33. Thus, until the insert 200 is inserted, the two blocking members 33 seal the interface hole 221. When the insert 200 is inserted into the interface hole 221, the two blocking members 32 are moved away from each other, thereby the elastic members 33 are deformed. When the insert 200 is pulled out of the interface hole 221, the two blocking members 32 are moved toward each other under the elastic force of the elastic members 33, and again seal the interface hole 221. Therefore, the interface hole 221 can be opened and closed as needed.

In other embodiments, the mounting members 31 can be omitted, and the elastic members 33 are connected to the bottom wall 21. The base portion 321 of the blocking member 32 can be omitted, and the elastic member 33 then resists against the resisting portion 32. The blocking member 32 can be other shapes, as long as the interface hole 221 can be opened or closed by moving the blocking member 32 relative to the bottom housing 20.

Figure 7:
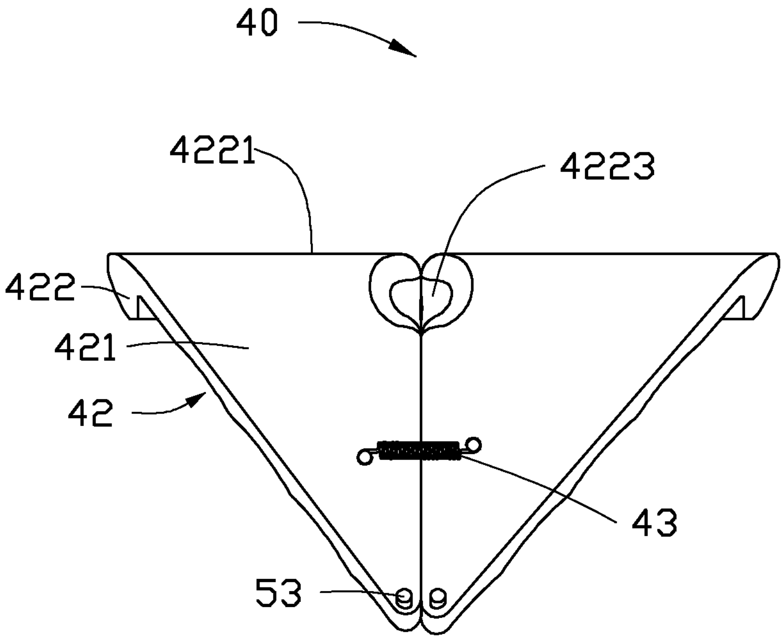
FIG. 7 is an assembled, isometric view of a second embodiment of a dust-proof mechanism.

FIG. 7 shows a second embodiment of a dust-proof mechanism 40. The dust-proof mechanism 40 has a similar structure to the dust-proof mechanism 30. However, the dust-proof mechanism 40 includes two blocking members 42 and one elastic member 43. The blocking members 42 are rotatably mounted on the bottom wall 21 by two rotation shafts 53. The elastic member 43 interconnects one blocking member 42 with the other blocking member 42. The blocking member 42 is substantially triangular. The elastic member 43 is a tension spring. In alternative embodiments, the blocking members 42 can be connected to the bottom housing 20 by another structure, as long as the blocking members 42 are rotatable relative to each other. The elastic member 43 is connected to the blocking members 42 by screws or pins.

The blocking member 42 includes a base portion 421 and a resisting portion 422 protruding from one end of the base portion 421. The two blocking members 42 are pulled towards each other under an elastic force of the elastic member 43, thereby closing the interface hole 221. The blocking member 42 includes a guiding surface 4223 corresponding to the interface hole 221, for guiding the insert 200. When the insert 200 is inserted into the interface hole 221, the two blocking members 42 are rotated away from each other. When the insert 200 is pulled out of the interface hole 221, the two blocking members 42 rotate back towards each other under the elastic force of the elastic member 43, thereby again sealing the interface hole 221 against dust.

It is to be understood, however, that even though numerous characteristics and advantages of the disclosure have been set forth in the foregoing description, together with details of the structure and function of the embodiments, the disclosure is illustrative only, and changes may be made in detail, especially in the matters of shape, size, and arrangement of parts within the principles of the embodiments to the full extent indicated by the broad general meaning of the terms in which the appended claims are expressed.

What is claimed is:

1. A dust-proof mechanism used for an electronic device housing, comprising:

two mounting members oppositely mounted inside of the electronic device housing; and two blocking members movably coupled to the mounting members respectively by at least one elastic member and configured to seals an interface hole of the electronic device housing, each of the two blocking members comprising a guiding surface;

wherein the two blocking members are pushed or pulled together by the at least one elastic member, when an insert is inserted into the interface hole, each of the guiding surfaces guide the insert, and the two blocking members are moved away from each other to open the interface hole; when the insert is pulled out of the interface hole, the two blocking members are moved toward each other by the elastic member and the two blocking members close the interface hole.

2. The dust-proof mechanism of claim 1, wherein the mounting members are correspondingly located relative to the interface hole, each of the two mounting members and a sidewall of the electronic device housing cooperatively form a support portion, each of the two blocking members is slidable in the support portion, the at least one elastic member comprises two elastic members, one end of each of the two elastic members is connected to one of the two mounting members, and another end of each of the two elastic members is connected to one of the two blocking members.

3. The dust-proof mechanism of claim 2, wherein each of the two mounting members comprises a main body and a receiving portion formed by a depression in the main body, each of the two blocking members comprises a base portion, and opposite surfaces of the base portion respectively contact the electronic device housing and the receiving portion.

4. The dust-proof mechanism of claim 3, wherein the each of the blocking members further comprises a resisting portion extending from the base portion, the resisting portion comprises a resisting surface and an end surface connected to the resisting surface, the resisting surface is configured to contact the sidewall of the electronic device housing, and the end surface contacts the main body.

5. The dust-proof mechanism of claim 3, wherein the support portion defines a guiding groove, the resisting portion is slidably received in the guiding groove.

6. The dust-proof mechanism of claim 1, wherein one end of the at least one elastic member is configured to be connected to the electronic device housing, and another end of the at least one elastic member is connected to each of the two blocking members.

7. The dust-proof mechanism of claim 1, wherein the at least one elastic member is a bent elastic sheet or a spring.

8. The dust-proof mechanism of claim 1, wherein the two blocking members are rotatably mounted on the electronic device housing, the at least one elastic member interconnects each of the two blocking members such that the two blocking members are pulled toward each other by the at least one elastic member.

9. The dust-proof mechanism of claim 8, wherein the at least one elastic member is a tension spring.

10. An electronic device, comprising:

a bottom housing comprising a bottom wall and a sidewall extending from a periphery of the bottom wall, the bottom wall and the sidewall cooperatively defining a receiving space, the sidewall defining an interface hole; and a dust-proof mechanism mounted on the bottom housing correspondingly located relative to the interface hole, the dust-proof mechanism being configured to seal the interface hole, the dust-proof mechanism comprising:

two mounting members oppositely mounted inside of the bottom housing; and two blocking members movably coupled to the mounting members respectively by at least one elastic member and configured to seal the interface hole, each of the two blocking members comprising a guiding surface;

wherein the two blocking members are pushed or pulled together by the at least one elastic member, when an insert is inserted into the interface hole, each of the guiding surfaces guide the insert, and the two blocking members are moved away from each other to open the interface hole; when the insert is pulled out of the interface hole, the two blocking members are moved toward each other by the elastic member and the two blocking members close the interface hole.

11. The electronic device of claim 10, wherein the mounting members are correspondingly located relative to the interface hole, each of the two mounting members and the sidewall cooperatively form a support portion, each of the two blocking members is slidable in the support portion, the at least one elastic member comprises two elastic member, one end of each of the two elastic member is connected to each of the two mounting members, and another end of each of the two elastic member is connected to each of the two blocking members.

12. The electronic device of claim 11, wherein each of the two mounting members comprises a main body and a receiving portion formed by a depression in the main body, each of the two blocking members comprises a base portion, and opposite surfaces of the base portion respectively contact the bottom wall and the receiving portion.

13. The electronic device of claim 12, wherein the each of the blocking members further comprises a resisting portion extending from the base portion, the resisting portion comprises a resisting surface and an end surface connected to the resisting surface, the resisting surface contacts the sidewall, and the end surface contacts the main body.

14. The electronic device of claim 12, wherein the support portion defines a guiding groove, the resisting portion is slidably received in the guiding groove.

15. The electronic device of claim 10, wherein one end of the at least one elastic member is connected to the bottom wall, and another end of the at least one elastic member is connected to each of the two blocking members.

16. The electronic device of claim 10, wherein the at least one elastic member is a bent elastic sheet or a spring.

17. The electronic device of claim 10, wherein each of the two blocking members is rotatably mounted on the bottom housing, the at least one elastic member interconnects each of the two blocking members such that the two blocking members are pulled toward each other by the at least one elastic member.

18. The electronic device of claim 17, wherein the at least one elastic member is an tension spring.

* * * * *